(12) United States Patent
Jang et al.

(10) Patent No.: US 7,071,732 B1
(45) Date of Patent: Jul. 4, 2006

(54) SCALABLE COMPLEX PROGRAMMABLE LOGIC DEVICE WITH SEGMENTED INTERCONNECT RESOURCES

(75) Inventors: Tetse Jang, San Jose, CA (US); Shi-dong Zhou, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 49 days.

(21) Appl. No.: 10/732,334

(22) Filed: Dec. 9, 2003

(51) Int. Cl.
*H03K 19/177* (2006.01)

(52) U.S. Cl. .............................. 326/41; 326/38; 326/39

(58) Field of Classification Search ............ 326/37–41, 326/47
See application file for complete search history.

(56) References Cited

U.S. PATENT DOCUMENTS

| | | | |
|---|---|---|---|
| RE34,363 E | | 8/1993 | Freeman |
| 5,267,187 A | | 11/1993 | Hsieh et al. |
| 5,349,250 A | | 9/1994 | New |
| 5,352,940 A | * | 10/1994 | Watson ........................ 326/44 |
| 5,357,153 A | | 10/1994 | Chiang et al. |
| 5,365,125 A | | 11/1994 | Goetting et al. |
| 5,444,394 A | | 8/1995 | Watson et al. |
| 5,455,525 A | * | 10/1995 | Ho et al. ........................ 326/41 |
| 5,668,771 A | | 9/1997 | Cliff et al. |
| 5,889,411 A | | 3/1999 | Chaudhary |
| 5,914,616 A | | 6/1999 | Young et al. |
| 6,107,822 A | | 8/2000 | Mendel et al. |
| 6,118,300 A | | 9/2000 | Wittig et al. |
| 6,150,838 A | | 11/2000 | Wittig et al. |
| 6,184,712 B1 | | 2/2001 | Wittig et al. |
| 6,191,610 B1 | | 2/2001 | Wittig et al. |
| 6,191,611 B1 | * | 2/2001 | Altaf ............................ 326/39 |
| 6,191,683 B1 | | 2/2001 | Nygaard, Jr. |
| 6,208,163 B1 | | 3/2001 | Wittig et al. |
| 6,246,260 B1 | * | 6/2001 | Mendel ........................ 326/41 |
| 6,396,302 B1 | | 5/2002 | New et al. |
| 6,400,180 B1 | | 6/2002 | Wittig et al. |
| 6,480,023 B1 | | 11/2002 | Kaviani |
| 6,501,296 B1 | | 12/2002 | Wittig et al. |
| 6,630,841 B1 | | 10/2003 | New et al. |

OTHER PUBLICATIONS

U.S. Appl. No. 10/233,244, filed Aug. 30, 2002, Ganesan et al.
U.S. Appl. No. 10/639,874, filed Aug. 12, 2003, New et al.
Xilinx, Inc.; "The Programmable Logic Data Book 2000"; published 2000; available from Xilinx, Inc., 2100 Logic Drive, San Jose, California 95124; pp.: 6-1 through 6-60.

(Continued)

*Primary Examiner*—Anh Q. Tran
(74) *Attorney, Agent, or Firm*—Lois D. Cartier

(57) ABSTRACT

A complex programmable logic device (CPLD) that can be scaled upwards in size without unacceptable increases in die size or signal delays. A CPLD includes a two-dimensional array including rows and columns of function blocks and input/output (I/O) blocks programmably interconnected by a de-centralized interconnect structure. The interconnect structure includes numbers of interconnect lines segmented into shorter lengths. Programmable multiplexer circuits couple the segmented interconnect lines to the function blocks and I/O blocks. Programmable switch matrices couple the segmented interconnect lines together into longer interconnect lines of the desired length.

21 Claims, 5 Drawing Sheets

OTHER PUBLICATIONS

Xilinx, Inc.; "The Programmable Logic Data Book 2000"; published 2000; available from Xilinx, Inc., 2100 Logic Drive, San Jose, California 95124; pp. 3-75 through 3-96.

Xilinx, Inc.; "Virtex-II Platform FPGA Handbook"; published Dec. 2000; available from Xilinx, Inc., 2100 Logic Drive, San Jose, California 95124; pp. 33-75.

Xilinx, Inc.; "The Programmable Logic Data Book"; copyright 1996; available from Xilinx, Inc., 2100 Logic Drive, San Jose, California 95124; pp. 4-32 through 4-37.

Rhyne; "Fundamental of Digital Systems Design"; New Jersey; 1973; pp. 70-71.

Xilinx, Inc.; "The Programmable Logic Data Book 2000"; published 2000; available from Xilinx, Inc., 2100 Logic Drive, San Jose, California 95124; pp.: 6-1 through 6-60, no month.

Xilinx, Inc.; "The Programmable Logic Data Book 2000"; published 2000; available from Xilinx, Inc., 2100 Logic Drive, San Jose, California 95124; pp. 3-75 through 3-96, no month.

Xilinx, Inc.; "The Programmable Logic Data Book"; copyright 1996; available from Xilinx, Inc., 2100 Logic Drive, San Jose, California 95124; pp. 4-32 through 4-37, no month.

Rhyne; "Fundamental of Digital Systems Design"; New Jersey; 1973; pp. 70-71, no month.

* cited by examiner

US 7,071,732 B1

SCALABLE COMPLEX PROGRAMMABLE LOGIC DEVICE WITH SEGMENTED INTERCONNECT RESOURCES

FIELD OF THE INVENTION

The invention relates to complex programmable logic devices (CPLDs). More particularly, the invention relates to a CPLD architecture including segmented interconnect resources that facilitate scaling the CPLD to vary the size and logic capacity thereof.

BACKGROUND OF THE INVENTION

A complex programmable logic device, or CPLD, typically includes two or more "function blocks" connected together and to input/output (I/O) resources by an centralized interconnect structure. In some CPLDs, configuration data is stored on-chip in non-volatile memory. In other CPLDs, configuration data is stored on-chip in non-volatile memory, then downloaded to volatile memory as part of an initial configuration sequence.

FIG. 1 is a simplified illustration of a CPLD. A CPLD typically includes two or more function blocks (FBs 101a–101h) connected together and to input/output (I/O) blocks (I/Os 102a–102f) by a centralized interconnect structure (CIS) 103. Centralized interconnect structure 103 includes many programmable multiplexers 105, each including several programmable interconnect points (PIPs) 104 (designated in the figures by small circles). FIG. 1A illustrates how a group of PIPs 105 can be combined to form a programmable multiplexer. In each multiplexer 105, only one PIP 104 is enabled. The enabled PIP selects one of the many input signals provided to the centralized interconnect structure, and the selected input signal is provided as the output signal OUT from programmable multiplexer 105.

Each function block includes one or more macrocells. A macrocell is a two-level AND/OR structure similar to those used in Programmable Logic Arrays (PLAs) and Programmable Array Logic (PAL) devices. FIG. 2 is a block diagram of a function block from one known CPLD, the CoolRunner®-II CPLD from Xilinx, Inc. The function block includes a PLA array and 16 macrocells MC1–MC16. The PLA array is driven by 40 input signals from a centralized interconnect structure (CIS). Each macrocell provides one output signal, which is provided to one of the I/O blocks (IOBs) and also returns to the centralized interconnect structure CIS to provide one of the input signals (see FIG. 1). Therefore, each function block has 40 data inputs and 16 data outputs. Each macrocell also receives several global signals, including a global set/reset signal and three global clock signals.

Further information on Xilinx CPLDs can be found in pages 6-1 through 6-60 of the Xilinx 2000 Data Book entitled "The Programmable Logic Data Book 2000", published in 2000 and available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

Practically speaking, the number of function blocks in a traditional CPLD is inherently limited by the size of the centralized interconnect structure. Increasing the size of the centralized interconnect structure above a certain threshold increases the CPLD die size dramatically. One method that has been suggested to overcome this limitation is to apply a hierarchical approach, dividing the logic in the centralized interconnect structure into several logic levels. This approach does reduce the die size, but the signal delay through the multiple logic levels leads to performance degradation.

Therefore, it is desirable to provide a new CPLD architecture that allows a CPLD to be scaled in logic capacity without an unacceptable increase in die size or signal delays.

SUMMARY OF THE INVENTION

The invention provides a complex programmable logic device (CPLD) that can be scaled upwards in size without unacceptable increases in die size or signal delays. A CPLD includes a two-dimensional array including rows and columns of function blocks and input/output (I/O) blocks programmably interconnected by a de-centralized interconnect structure. The interconnect structure includes numbers of interconnect lines segmented into shorter lengths. Programmable multiplexer circuits couple the segmented interconnect lines to the function blocks and I/O blocks. Programmable switch matrices couple the segmented interconnect lines together into longer interconnect lines of the desired length.

According to a first aspect of the invention, a programmable logic device (PLD) includes a plurality of complex programmable logic device (CPLD) function blocks disposed to implement a two-dimensional array of the CPLD function blocks; a plurality of input/output (I/O) blocks; a plurality of segmented interconnect lines; a plurality of first programmable multiplexer circuits programmably coupling the CPLD function blocks to the segmented interconnect lines; a plurality of second programmable multiplexer circuits programmably coupling the I/O blocks to the segmented interconnect lines; and a plurality of programmable switch matrices programmably coupling the segmented interconnect lines one to another.

According to another aspect of the invention, a PLD includes a plurality of CPLD function blocks disposed to implement a two-dimensional array comprising rows and columns of the CPLD function blocks; a plurality of first segmented interconnect lines disposed between adjacent rows of the CPLD function blocks; a plurality of second segmented interconnect lines disposed between adjacent columns of the CPLD function blocks; and a plurality of first programmable multiplexer circuits programmably coupling the CPLD function blocks to the first and second segmented interconnect lines.

According to yet another aspect of the invention, a PLD includes a two-dimensional array comprising rows and columns of CPLD function blocks and I/O blocks; a programmable interconnect structure disposed between each pair of adjacent rows and each pair of adjacent columns in the array, the programmable interconnect structure comprising a plurality of segmented interconnect lines; and a plurality of programmable multiplexer circuits programmably coupling the CPLD function blocks and the I/O blocks to the programmable interconnect structure.

DETAILED DESCRIPTION OF THE DRAWINGS

Figure 3:
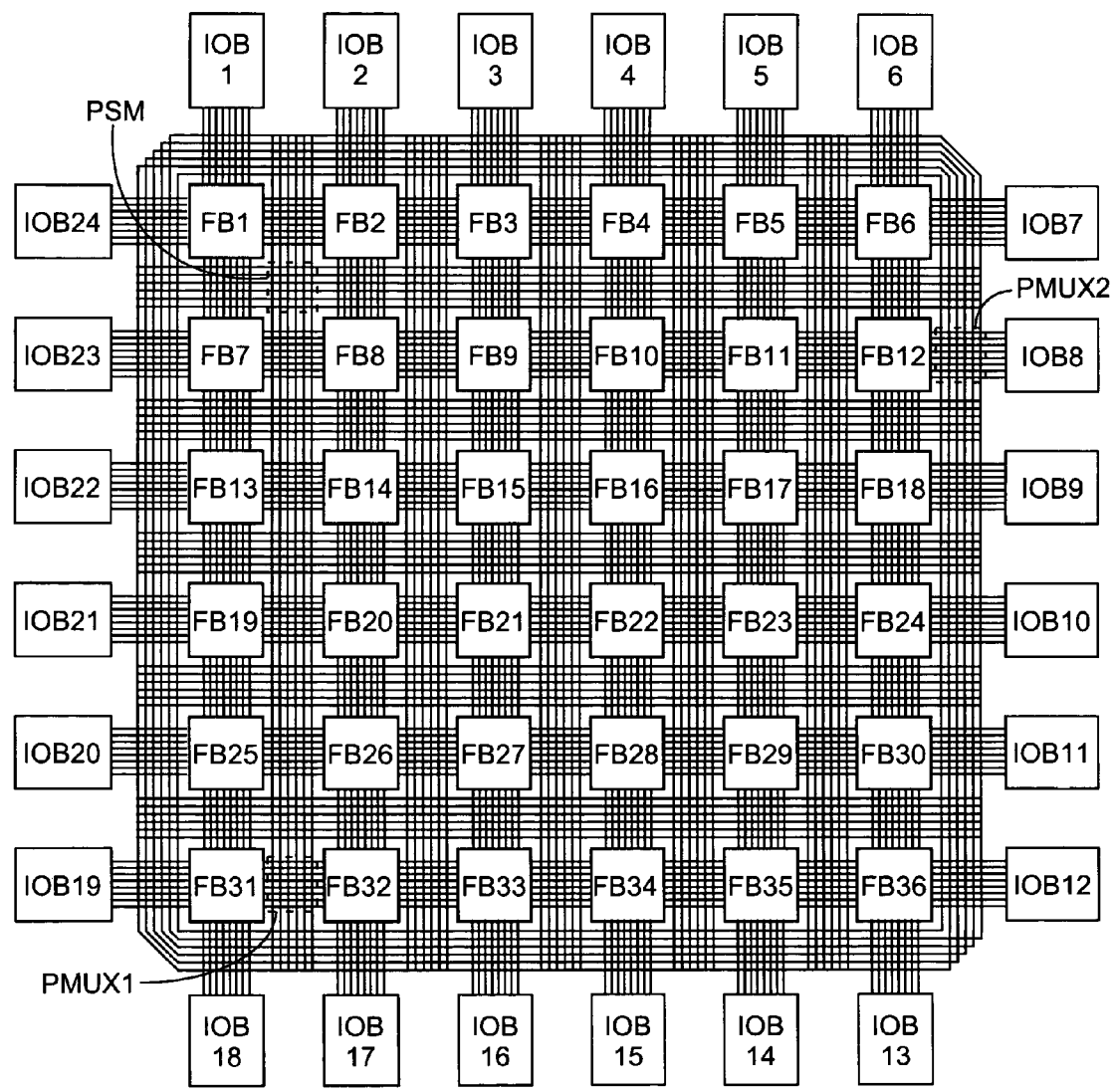
FIG. 3 is a block diagram of a CPLD including function blocks dispersed in a two-dimensional array and interconnected by a de-centralized interconnect structure, according to one embodiment of the present invention.
Figure 4:
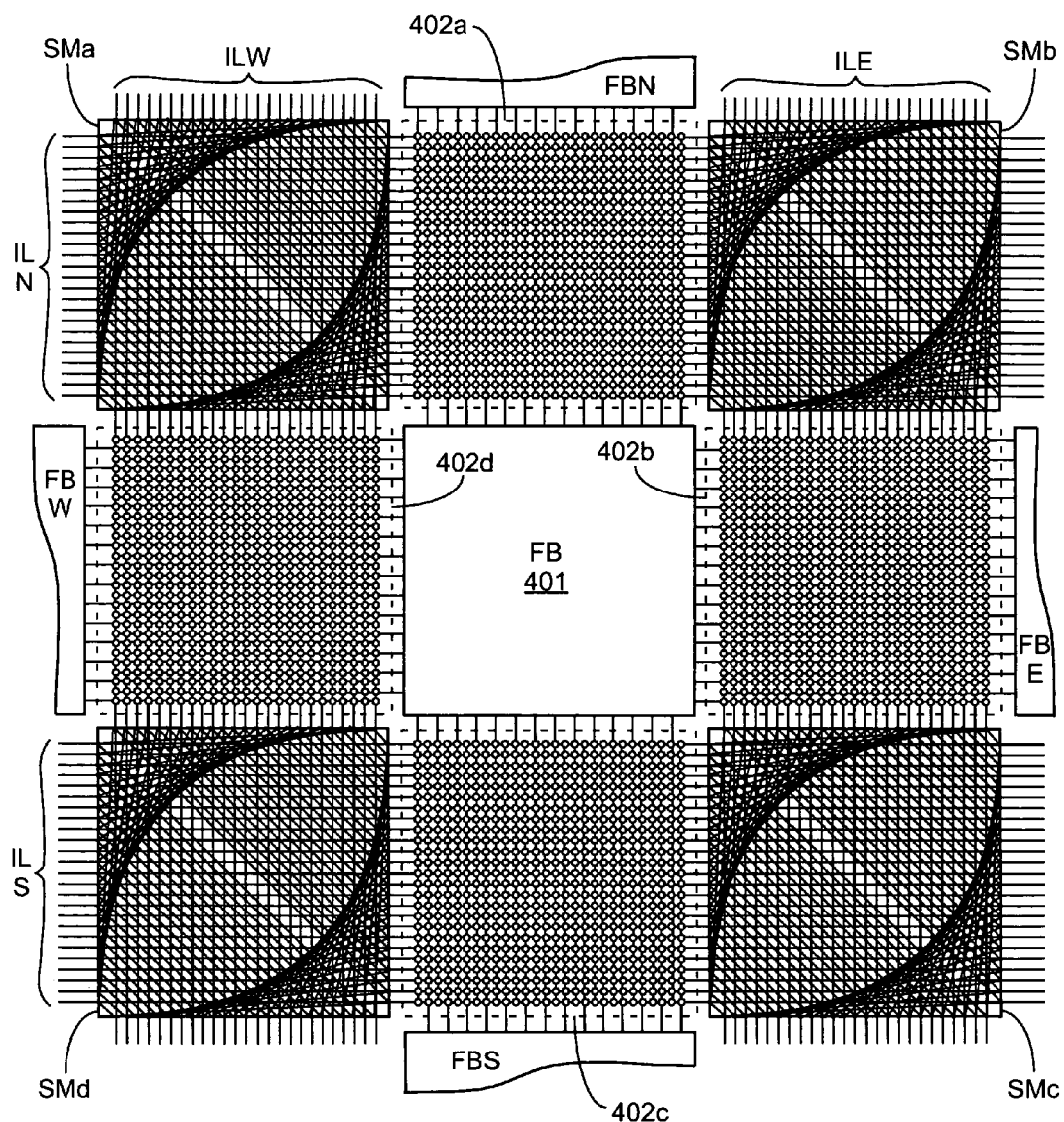
FIG. 4 illustrates in more detail a portion of FIG. 3 that includes a function block and the adjacent portions of the interconnect structure.
Figure 5:
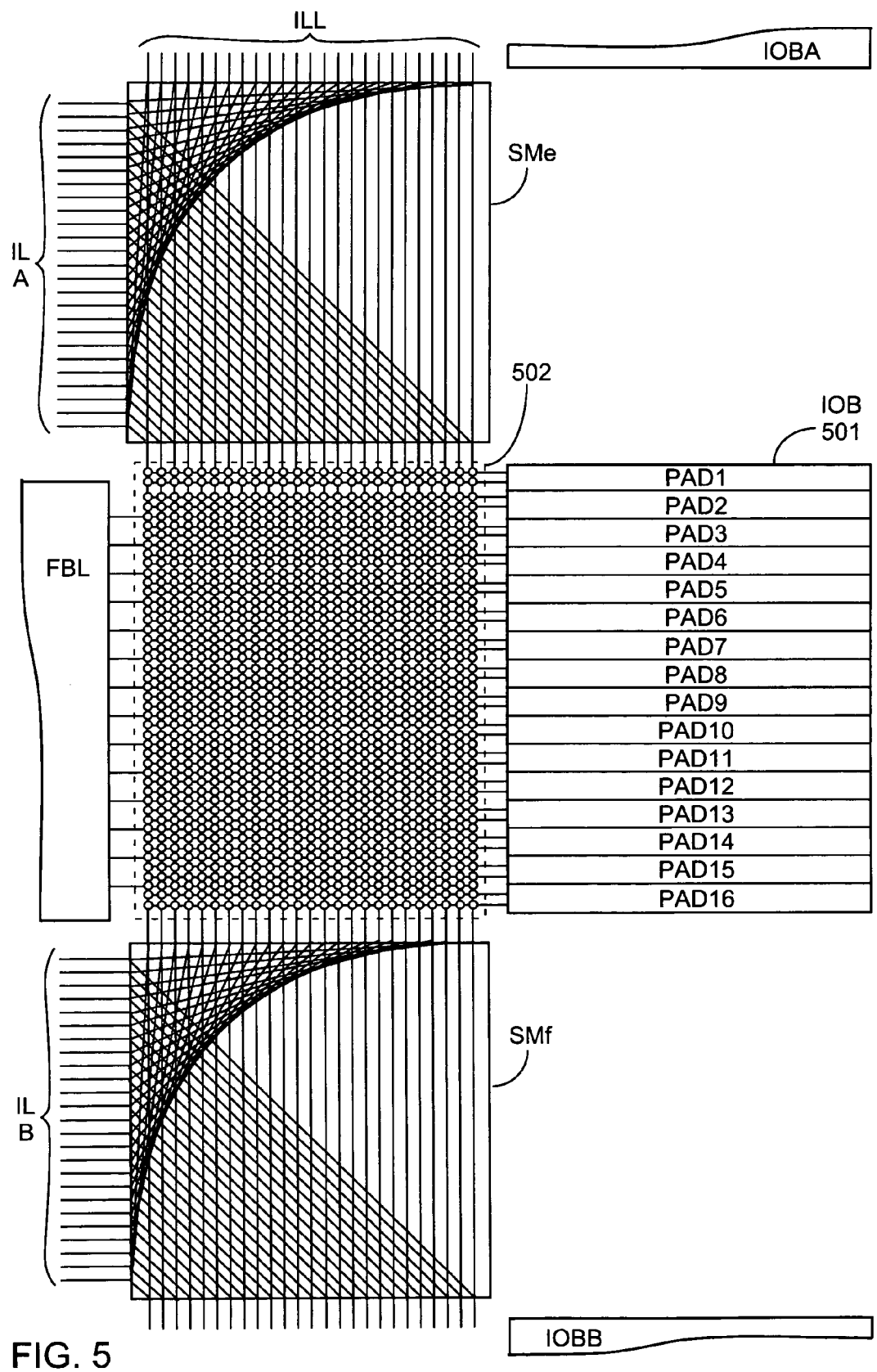
FIG. 5 illustrates in more detail a portion of FIG. 3 that includes an input/output (I/O) block and the adjacent portions of the interconnect structure.

The present invention is illustrated by way of example, and not by way of limitation, in FIGS. 3–5, which are now described.

FIGS. 3–5 illustrate a novel CPLD architecture that allows the inclusion of a large number of CPLD function blocks and I/O blocks, but does not necessitate an unacceptably large die size. The illustrated CPLD architecture does not include a single centralized interconnect structure. Instead, the interconnect structure is de-centralized, and includes numbers of interconnect lines segmented into shorter lengths. Programmable multiplexer circuits couple the segmented interconnect lines to the function blocks and I/O blocks. Programmable switch matrices couple the segmented interconnect lines into longer interconnect lines of the desired length.

FIG. 3 is a block diagram of a CPLD including function blocks FB1–FB36 dispersed in a two-dimensional array and interconnected by a de-centralized programmable interconnect structure. I/O blocks IOB1–IOB24 are disposed in a ring around the array of function blocks. Note that the number of function blocks and I/O blocks shown in FIG. 3 is exemplary, and any number of these elements can be included. Similarly, the number of interconnect lines shown between the rows and columns of function blocks is purely exemplary, and can be any desired number. As shown in FIGS. 4 and 5, in one embodiment 25 interconnect lines are provided between each adjacent row and each adjacent column of function blocks. FIG. 3 shows only six interconnect lines between each row and column, for clarity.

The interconnect structure illustrated in FIG. 3 includes horizontal and vertical segmented interconnect lines. At the point of intersection between the horizontal and vertical interconnect lines are programmable switch matrices, or PSMs. A programmable switch matrix can be programmed, for example, to couple together two horizontal interconnect lines with adjacent end points (e.g., sharing the same horizontal "routing track"), two vertical horizontal interconnect lines with adjacent end points (e.g., sharing the same vertical routing track), and/or a horizontal interconnect line and a vertical interconnect line.

The segmented interconnect lines can be all of one length, or of different lengths. For example, some of the interconnect lines can span one function block, while others span two or more function blocks. In some embodiments, the interconnect lines span one, two, three, and six function blocks. In some embodiments, some of the interconnect lines span an entire column or row of function blocks, while others span one half or one quarter of a column or row. Many other combinations of interconnect line lengths can also be used.

Programmable switch matrices and segmented interconnect lines are well known in the arts relevant to programmable logic devices (PLDs). For example, field programmable gate arrays (FPGAs) such as the Virtex® FPGAs from Xilinx, Inc. use programmable switch matrices to interconnect segmented interconnect lines. The Virtex FPGA is described in detail in pages 3–75 through 3–96 of the Xilinx 2000 Data Book entitled "The Programmable Logic Data Book 2000", referenced above, which pages are incorporated herein by reference. Young et al. further describe the interconnect structure of the Virtex FPGA in U.S. Pat. No. 5,914,616, issued Jun. 22, 1999 and entitled "FPGA Repeatable Interconnect Structure with Hierarchical Interconnect Lines", which is incorporated herein by reference in its entirety.

In some embodiments of the invention, the de-centralized interconnect structure included in the CPLD is similar to the interconnect structure included in Virtex FPGAs. In other embodiments, the de-centralized interconnect structure included in the CPLD is similar to the interconnect structure of the Xilinx Virtex-II FPGAs, which are described in pages 33–75 of the "Virtex-II Platform FPGA Handbook", published December, 2000, available from Xilinx, Inc., 2100 Logic Drive, San Jose, Calif. 95124, which pages are incorporated herein by reference.

Figure 1:
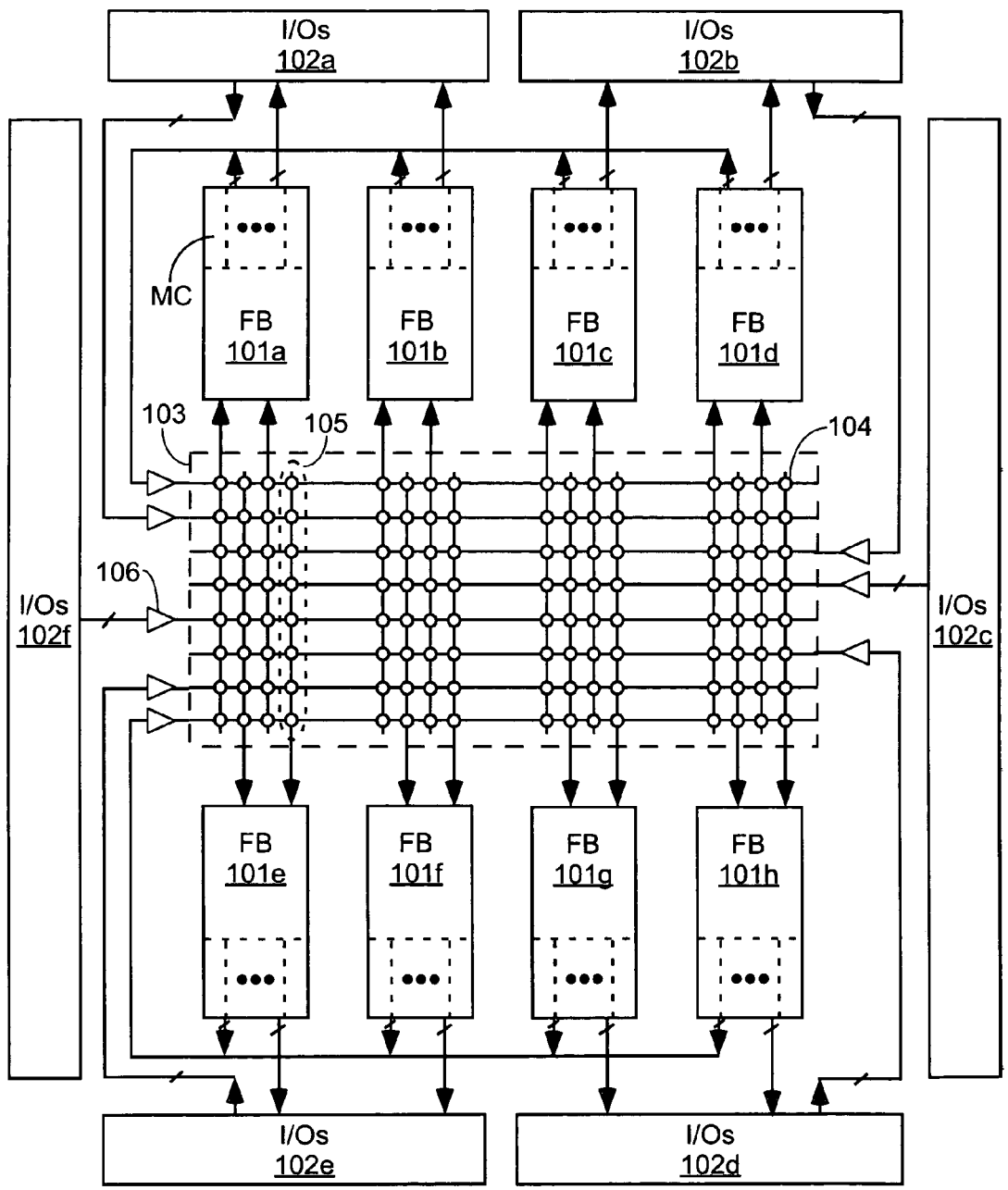
FIG. 1 is a block diagram of a prior art complex programmable logic device (CPLD).
Figure 1A:
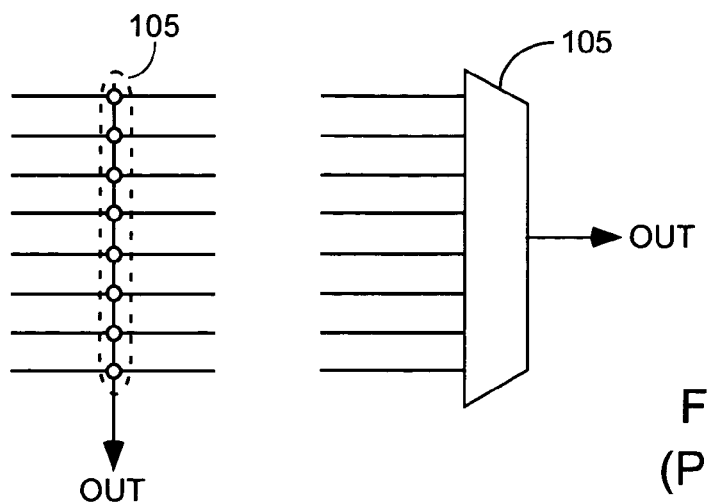
FIG. 1A illustrates how a group of programmable interconnect points (PIPs) in the CPLD of FIG. 1 is used to implement a programmable multiplexer.

The interconnect structure illustrated in FIG. 3 also includes a number of programmable multiplexer circuits (e.g., PMUX1 and PMUX2) that can include, for example, a number of copies of programmable multiplexer 105 (see FIGS. 1 and 1A). A first type of programmable multiplexer circuit (e.g., PMUX1) programmably couples CPLD function blocks FB1–FB36 to the segmented interconnect lines. A second type of programmable multiplexer circuit (e.g., PMUX2) programmably couples I/O blocks IOB1–IOB24 to the segmented interconnect lines.

FIG. 4 illustrates a function block (FB) 401 and the surrounding portions of the interconnect structure. To the left ("west") of function block 401 in FIG. 4 is function block FBW. To the right ("east"), is function block FBE. Above and below (to the "north" and "south") are function blocks FBN and FBS, respectively.

A first set of segmented interconnect lines ILN runs horizontally between the row of function blocks that includes function block 401 and the row of function blocks including function block FBN. A second set of segmented interconnect lines ILS runs horizontally between the row of function blocks that includes function block 401 and the row of function blocks including function block FBS. Third and fourth sets ILW and ILE of segmented interconnect lines run vertically between the column including function block 401 and the columns including function blocks FBW and FBE, respectively.

Programmable switch matrices SMa–SMd illustrate one embodiment, for example, of element PSM of FIG. 3. Programmable switch matrices SMa–SMd are located at each intersection of the vertical and horizontal sets of interconnect lines. In the illustrated embodiment, for example, programmable connections can be made between two horizontal interconnect lines sharing the same horizontal routing track, two vertical horizontal interconnect lines sharing the same vertical routing track, and/or a horizontal interconnect line and a vertical interconnect line. The illustrated interconnections provided by programmable switch matrices SMa–SMd are purely exemplary, and other embodiments provide different connections, fewer connections, or additional connections not shown in FIG. 4.

Figure 2:
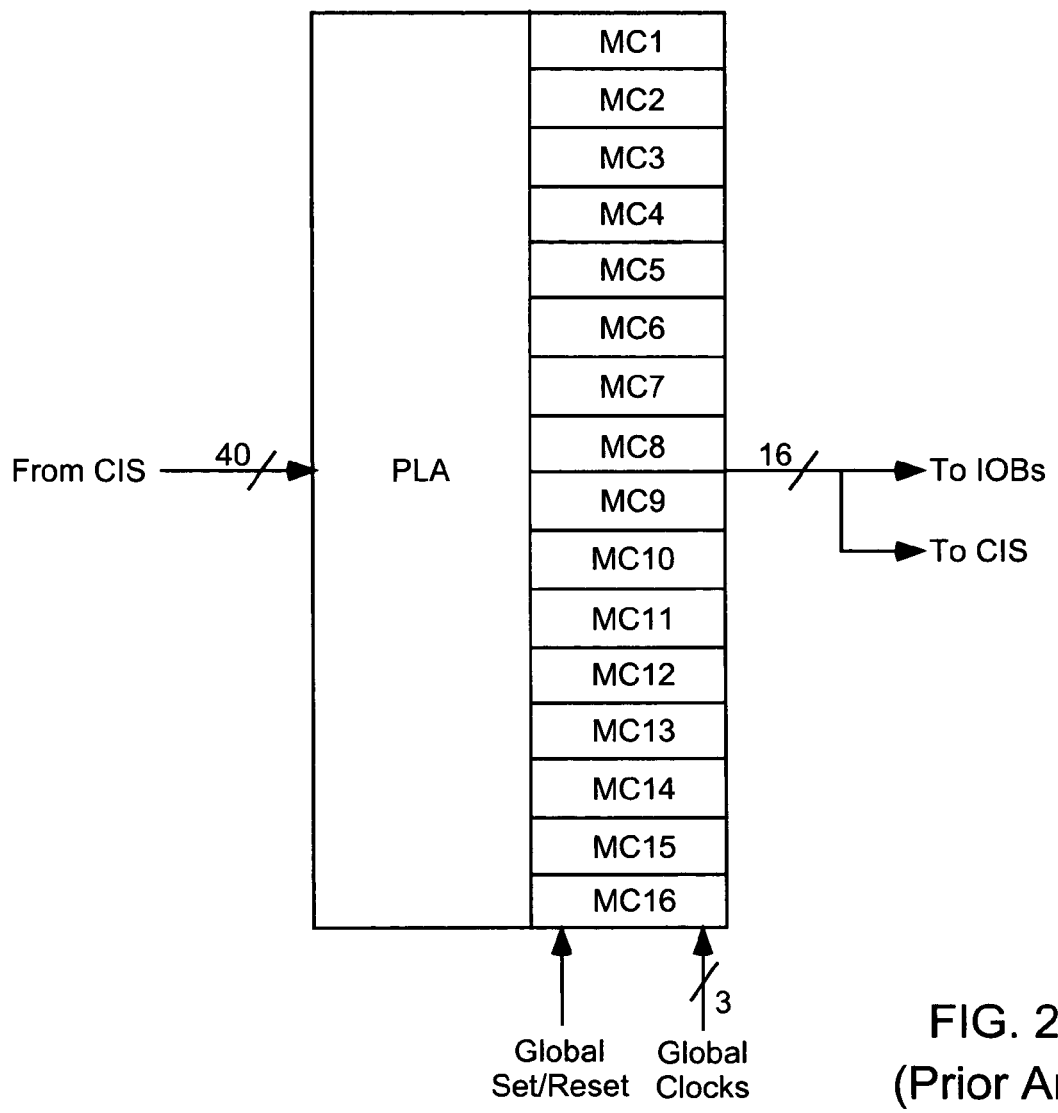
FIG. 2 is a block diagram of a CPLD function block that can be used, for example, in the CPLD of FIG. 1.

Programmable multiplexer circuits 402a–402d illustrate an embodiment, for example, of element PMUX1 of FIG. 3. Programmable multiplexer circuits 402a–402d allow the programmable interconnection of function block 401 to the vertical and horizontal interconnect lines. In one embodiment, function block 401 is the same as the CPLD function block illustrated in FIG. 2. Thus, the function block has 40 data input signals and 16 data output signals. In the pictured embodiment, each edge of function block 401 includes ten data input terminals and four data output signals. Thus, the input and output terminals are evenly distributed around the function block to improve the routing efficiency of the interconnect structure. To further improve the routing efficiency, the fitter software that assigns user logic to the various function blocks can attempt to evenly distribute the logic among the function blocks. The fitter software can also attempt to assign the user logic within each function block to evenly utilize the input and output terminals on all four sides of the function block.

In the illustrated embodiment, programmable multiplexer circuits 402a–402d include a programmable connection between each function block data terminal and each interconnect line in the adjacent set of interconnect lines. In some embodiments, programmable connections are provided between each function block data terminal and only a subset of the adjacent interconnect lines. In some embodiments, the selected subset is different for each function block data terminal.

Programmable multiplexer circuits 402a–402d can be implemented, for example, using a number of copies of programmable multiplexer 105 of FIGS. 1 and 1A, or using other techniques well-known in the PLD arts. The illustrated interconnections provided by programmable multiplexer circuits 402a–402d are purely exemplary, and other embodiments provide different connections, fewer connections, or additional connections not shown in FIG. 4.

FIG. 5 illustrates an exemplary I/O block (IOB) 501 and the adjacent interconnect structure. Clearly, the illustrated I/O block lies along the right edge of the CPLD shown in FIG. 3. To the left of I/O block 501 in FIG. 5 is function block FBL. Above and below I/O block 501 are I/O blocks IOBA and IOBB, respectively.

A first set of segmented interconnect lines ILA runs horizontally between the row of programmable blocks that includes I/O block 501 and the row of programmable blocks including I/O block IOBA. A second set of segmented interconnect lines ILB runs horizontally between the row of programmable blocks that includes I/O block 501 and the row of programmable blocks including I/O block IOBB. A third set ILL of segmented interconnect lines runs vertically between the column including function block FBL and the column including I/O block 501.

Programmable switch matrices SMe–SMf are located at each intersection of the vertical and horizontal sets of interconnect lines. In the illustrated embodiment, programmable connections can be made between two vertical horizontal interconnect lines sharing the same vertical routing track, and/or between a horizontal interconnect line and a vertical interconnect line. Note that programmable switch matrices SMe–SMf are different from programmable switch matrices SMa–SMd of FIG. 4. All connections to the interconnect lines extending to the "east" of the switch matrix are omitted, because the horizontal segmented interconnect lines ILA and ILB terminate at the switch matrices SMe and SMf. However, the illustrated interconnections provided by programmable switch matrices SMe–SMf are purely exemplary, and other embodiments provide different connections, fewer connections, or additional connections not shown in FIG. 5.

Programmable multiplexer circuit 502 illustrates one embodiment, for example, of element PMUX2 of FIG. 3.

Programmable multiplexer circuit 502 implements the programmable interconnection of function block FBL to the vertical interconnect lines ILL. As previously described, function block FBL has 14 data terminals (10 input terminals and 4 output terminals) on the rightmost edge. In the illustrated embodiment, programmable multiplexer circuit 502 includes a programmable connection between each of these terminals and each interconnect line in interconnect lines ILL. In some embodiments, programmable connections are provided between each terminal of function block FBL and only a subset of interconnect lines ILL. In some embodiments, the selected subset is different for each terminal of the function block.

Programmable multiplexer circuit 502 also implements the programmable interconnection of I/O block 501 to the vertical interconnect lines ILL. In the illustrated embodiment, I/O block 501 includes 16 I/O pads PAD1-PAD16. Each pad and the accompanying logic have two data terminals, one input terminal and one output terminal. In the illustrated embodiment, programmable multiplexer circuit 502 includes a programmable connection between each of these terminals and each interconnect line in interconnect lines ILL. In some embodiments, programmable connections are provided between each terminal of I/O block 501 and only a subset of interconnect lines ILL. In some embodiments, the selected subset is different for each terminal of the I/O block.

Programmable multiplexer circuit 502 can be implemented, for example, using a number of copies of programmable multiplexer 105 of FIGS. 1 and 1A, or using other techniques well-known in the PLD arts. The illustrated interconnections provided by programmable multiplexer circuit 502 are purely exemplary, and other embodiments provide different connections, fewer connections, or additional connections not shown in FIG. 5.

In the illustrated embodiments, an interior portion of the array is made up of CPLD function blocks, while the I/O blocks are implemented in a ring around the interior portion of the array. In other embodiments (not shown), the array of function blocks includes columns of I/O blocks interposed between columns of function blocks. In yet other embodiments (not shown), I/O blocks are interspersed between the function blocks within one or more columns of the array. It will be apparent to one skilled in the art after reading this specification that the present invention can be practiced within these and other architectural variations. Accordingly, all such modifications and additions are deemed to be within the scope of the invention, which is to be limited only by the appended claims and their equivalents.

What is claimed is:

1. A programmable logic device (PLD), comprising:
    a plurality of complex programmable logic device (CPLD) function blocks disposed to implement a two-dimensional array of the CPLD function blocks, each of the CPLD function blocks including a programmable logic array (PLA) and at least one CPLD macrocell comprising a two-level AND/OR structure;
    a plurality of input/output (I/O) blocks;
    a plurality of segmented interconnect lines;
    a plurality of first programmable multiplexer circuits programmably coupling the CPLD function blocks to the segmented interconnect lines;
    a plurality of second programmable multiplexer circuits programmably coupling the I/O blocks to the segmented interconnect lines; and a plurality of programmable switch matrices programmably coupling the segmented interconnect lines one to another.

2. The PLD of claim 1, wherein the array includes at least three rows and three columns of the CPLD function blocks.

3. The PLD of claim 1, wherein the segmented interconnect lines comprise interconnect lines having different lengths.

4. The PLD of claim 3, wherein the segmented interconnect lines comprise interconnect lines spanning different numbers of the CPLD function blocks.

5. The PLD of claim 1, wherein the segmented interconnect lines comprise a plurality of horizontal interconnect lines and a plurality of vertical interconnect lines.

6. The PLD of claim 5, wherein the programmable switch matrices programmably couple the horizontal interconnect lines to the vertical interconnect lines.

7. The PLD of claim 5, wherein the programmable switch matrices programmably couple the horizontal interconnect lines one to another and further programmably couple the vertical interconnect lines one to another.

8. A programmable logic device (PLD), comprising:
a plurality of complex programmable logic device (CPLD) function blocks disposed to implement a two-dimensional array comprising rows and columns of the CPLD function blocks, each of the CPLD function blocks including a programmable logic array (PLA) and at least one CPLD macrocell comprising a two-level AND/OR structure;
a plurality of first segmented interconnect lines disposed between adjacent rows of the CPLD function blocks;
a plurality of second segmented interconnect lines disposed between adjacent columns of the CPLD function blocks; and
a plurality of first programmable multiplexer circuits programmably coupling the CPLD function blocks to the first and second segmented interconnect lines.

9. The PLD of claim 8, further comprising:
a plurality of input/output (I/O) blocks; and
a plurality of second programmable multiplexer circuits programmably coupling the I/O blocks to the first and second segmented interconnect lines.

10. The PLD of claim 8, wherein the array includes at least three rows and three columns of the CPLD function blocks.

11. The PLD of claim 8, further comprising a plurality of programmable switch matrices programmably coupling the first segmented interconnect lines to the second segmented interconnect lines.

12. The PLD of claim 11, wherein the programmable switch matrices further programmably couple the first segmented interconnect lines one to another, and further programmably couple the second segmented interconnect lines one to another.

13. The PLD of claim 8, wherein each of the first and second segmented interconnect lines comprises interconnect lines having different lengths.

14. The PLD of claim 13, wherein each of the first and second segmented interconnect lines comprises interconnect lines spanning different numbers of the CPLD function blocks.

15. A programmable logic device (PLD), comprising:
a two-dimensional array comprising rows and columns of complex programmable logic device (CPLD) function blocks and input/output (I/O) blocks, each of the CPLD function blocks including a programmable logic array (PLA) and at least one CPLD macrocell comprising a two-level AND/OR structure;
a programmable interconnect structure disposed between each pair of adjacent rows and each pair of adjacent columns in the array, the programmable interconnect structure comprising a plurality of segmented interconnect lines; and
a plurality of programmable multiplexer circuits programmably coupling the CPLD function blocks and the I/O blocks to the programmable interconnect structure.

16. The PLD of claim 15, wherein the plurality of programmable multiplexer circuits comprises:
a plurality of first programmable multiplexer circuits programmably coupling the CPLD function blocks to the programmable interconnect structure; and
a plurality of second programmable multiplexer circuits programmably coupling the I/O blocks to the programmable interconnect structure.

17. The PLD of claim 15, wherein the array includes at least three rows and three columns of the CPLD function blocks.

18. The PLD of claim 15, wherein the programmable interconnect structure further comprises a plurality of programmable switch matrices programmably coupling the segmented interconnect lines one to another.

19. The PLD of claim 15, wherein the programmable interconnect structure further comprises segmented interconnect lines having different lengths.

20. The PLD of claim 19, wherein the segmented interconnect lines comprise interconnect lines spanning different numbers of the CPLD function blocks.

21. The PLD of claim 15, wherein the CPLD function blocks are implemented within an interior portion of the array, and the I/O blocks are implemented in a ring around the interior portion.

* * * * *